US 11,282,878 B2

(12) United States Patent
Shukuri et al.

(10) Patent No.: US 11,282,878 B2
(45) Date of Patent: Mar. 22, 2022

(54) SOLID-STATE IMAGING DEVICE AND CAMERA SYSTEM

(71) Applicant: FLOADIA CORPORATION, Kodaira (JP)

(72) Inventors: Shoji Shukuri, Kodaira (JP);
Kazumasa Yanagisawa, Kodaira (JP);
Toshifumi Takeda, Kodaira (JP);
Kosuke Okuyama, Kodaira (JP);
Yasuhiro Taniguchi, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 127 days.

(21) Appl. No.: 16/760,935

(22) PCT Filed: Dec. 26, 2018

(86) PCT No.: PCT/JP2018/047953
§ 371 (c)(1),
(2) Date: May 1, 2020

(87) PCT Pub. No.: WO2019/138894
PCT Pub. Date: Jul. 18, 2019

(65) Prior Publication Data
US 2021/0183925 A1 Jun. 17, 2021

(30) Foreign Application Priority Data
Jan. 9, 2018 (JP) .............................. JP2018-001487

(51) Int. Cl.
H04N 5/374 (2011.01)
H04N 5/343 (2011.01)
(Continued)

(52) U.S. Cl.
CPC .. H01L 27/14614 (2013.01); H01L 27/14643 (2013.01); H04N 5/37455 (2013.01)

(58) Field of Classification Search
CPC .. H04N 5/37455; H04N 5/3745; H04N 5/343; H04N 5/335; H01L 27/14614;
(Continued)

(56) References Cited

U.S. PATENT DOCUMENTS 6,784,933 B1 * 8/2004 Nakai .................... H04N 5/335
348/302
11,114,423 B2 * 9/2021 Iguchi .................. H01L 25/167
(Continued)

FOREIGN PATENT DOCUMENTS

| JP | 2006-237974 A | 9/2006 |
| JP | 2010056512 A | 3/2010 |
| JP | 2010226375 A | 10/2010 |

OTHER PUBLICATIONS

International Search Report issued in Patent Application No. PCT/JP2018/047953 dated Mar. 19, 2019.
(Continued)

Primary Examiner — Marly S Camargo
(74) Attorney, Agent, or Firm — Pearne & Gordon LLP

(57) ABSTRACT

The present invention provides a solid-state imaging device and a camera system capable of recording a still image without using a recording medium. Each pixel P of an image sensor is provided with a photodiode, a transfer transistor, a reset transistor, and an amplifying transistor, as well as a memory element that has functions of a select transistor. The memory element has a structure integrating a drain side select transistor, a source side select transistor, and a memory transistor. By applying a program voltage to a memory gate electrode as a gate voltage, the memory transistor stores charge of an amount corresponding to an amount of light received by the photodiode in a charge storage layer.

13 Claims, 11 Drawing Sheets

(51) Int. Cl.
    *H04N 5/335*     (2011.01)
    *H01L 27/146*     (2006.01)
    *H01L 29/788*     (2006.01)
    *H01L 29/792*     (2006.01)
    *H04N 5/3745*     (2011.01)

(58) Field of Classification Search
    CPC ......... H01L 27/14643; H01L 27/14603; H01L 29/788; H01L 29/792
    USPC .......... 348/207.99, 308, 301, 302, 294, 297, 348/231.1, 231.9, 523; 257/291, 292, 257/293, 443; 250/208.1
    See application file for complete search history.

(56) References Cited

U.S. PATENT DOCUMENTS

| | | | | |
|---|---|---|---|---|
| 2010/0231769 A1* | 9/2010 | Shizukuishi | ...... | H01L 27/14623 348/306 |
| 2010/0238310 A1 | 9/2010 | Shizukuishi | | |
| 2011/0085066 A1* | 4/2011 | Sugawa | ............. | H04N 5/37452 348/302 |
| 2014/0035619 A1* | 2/2014 | Zaitsu | .................... | G11C 11/34 326/41 |
| 2014/0061765 A1* | 3/2014 | Zaitsu | .................. | H01L 29/792 257/324 |
| 2015/0084098 A1* | 3/2015 | Choi | ................. | H01L 27/14887 257/230 |
| 2021/0329188 A1* | 10/2021 | Kawasaki | .......... | H04N 5/37455 |
| 2021/0392288 A1* | 12/2021 | Inoue | .................. | H04N 5/3745 |

OTHER PUBLICATIONS

Written Opinion issued in Patent Application No. PCT/JP2018/047953 dated Mar. 19, 2019.

Wan, Gordon, et al., "GMOS Image Sensors With Multi-Bucket Pixels for Computational Photography", IEEE Journal of Solid-State Circuits, vol. 47, No. 4, pp. 1031-1042, Apr. 2012.

* cited by examiner

SOLID-STATE IMAGING DEVICE AND CAMERA SYSTEM

TECHNICAL FIELD

The present invention relates to a solid-state imaging device and a camera system.

BACKGROUND ART

Camera systems that record images captured by an image sensor (solid-state imaging device) are used in apparatuses such as security cameras and drive recorders. A camera system includes components such as an image sensor that converts light from a subject into an electrical image signal, a signal processing circuit that performs processing such as gamma correction and color correction on the image signal, and a recording medium such as a memory card that records the image signal.

A CMOS sensor is often used as the image sensor. Each pixel of a CMOS image sensor typically includes components such as a photodiode that converts incident light into charge, a floating diffusion that converts the charge into a potential, a transfer transistor that transfers the charge in the photodiode to the floating diffusion, a reset transistor that resets the floating diffusion, and a select transistor that is turned on during a readout period in which a signal voltage is output (for example, see Non-Patent Literature 1).

CITATION LIST

Non-Patent Literature

Non-Patent Literature 1: Wan, G.; Xiangli Li; Agranov, G.; Levoy, M.; Horowitz, M., "CMOS Image Sensors With Multi-Bucket Pixels for Computational Photography," IEEE Journal of Solid-State Circuits vol. 47, no. 4, pp. 1031-1042, April 2012

SUMMARY OF INVENTION

Technical Problem

Meanwhile, from the perspective of ensuring credibility for example, a configuration that keeps a recorded image from being edited, rewritten, or erased may be desirable. However, in camera systems of the related art as described above, images are recorded to a recording medium such as a memory card or an optical disc under the presumption that the recording medium will be accessed by the user, making it easy to edit, rewrite, and erase the images.

The present invention has been devised in light of the above circumstances, and an object thereof is to provide a solid-state imaging device and a camera system that record a still image without using a recording medium.

Solution to Problem

A solid-state imaging device according to the present invention is provided with a pixel array in which a plurality of pixels are arranged. Each pixel includes a photodiode, a floating diffusion, a transfer transistor connected between the photodiode and the floating diffusion, an amplifying transistor having a gate connected to the floating diffusion, and a non-volatile memory section connected between a signal output line and the amplifying transistor. The non-volatile memory section includes a memory transistor and a first select transistor. The memory transistor is connected in series with the amplifying transistor between the amplifying transistor and the signal output line, and includes a memory gate electrode and a charge storage layer. The first select transistor is connected in series with the memory transistor between the amplifying transistor and the signal output line.

A camera system according to the present invention is provided with the above solid-state imaging device and a control section that applies a program voltage to the memory gate electrode in response to a trigger signal during imaging by the solid-state imaging device.

A solid-state imaging device according to the present invention has a normal mode in which an image signal corresponding to an amount of light received by a photodiode of a pixel is output, a save mode in which an analog amount corresponding to the amount of light received by the photodiode as stored information in a non-volatile memory section is stored in a non-volatile manner, and a readout mode in which the stored information stored in the non-volatile memory section in the save mode is converted into a multi-bit digital image signal, and the multi-bit digital image signal is output. Switching back to the save mode is prohibited, or alternatively, switching back to the save mode is allowed if an unlock operation is performed.

A camera system according to the present invention is provided with: a plurality of pixels, each pixel including a photodiode; an A/D conversion circuit that receives an image signal from each pixel as input; a memory transistor, connected between the photodiode and the A/D conversion circuit, that stores stored information corresponding to an amount of light received by the photodiode in response to a trigger signal; and an event detector that produces the trigger signal by detecting a predetermined event.

Advantageous Effects of Invention

According to the present invention, since a non-volatile memory section is provided inside each pixel of the solid-state imaging device, and a still image is recorded and the pixels of the still image are held inside the pixels by applying a program voltage as the gate voltage to the memory transistor of the non-volatile memory section, the still image is recorded without using a recording medium such as a memory card or an optical disc.

Also, according to the present invention, in a save mode, an analog amount corresponding to the amount of light received by the photodiode of each pixel is stored in the non-volatile memory section as stored information, and therefore the circuit configuration is reduced compared to a configuration that stores the amount as digital data.

Also, according to the present invention, since a memory transistor is connected between the photodiode and the A/D conversion circuit, and stored information corresponding to the amount of light received by the photodiode is stored in the memory transistor, an image is stored with few memory transistors.

DESCRIPTION OF EMBODIMENTS

Figure 1:
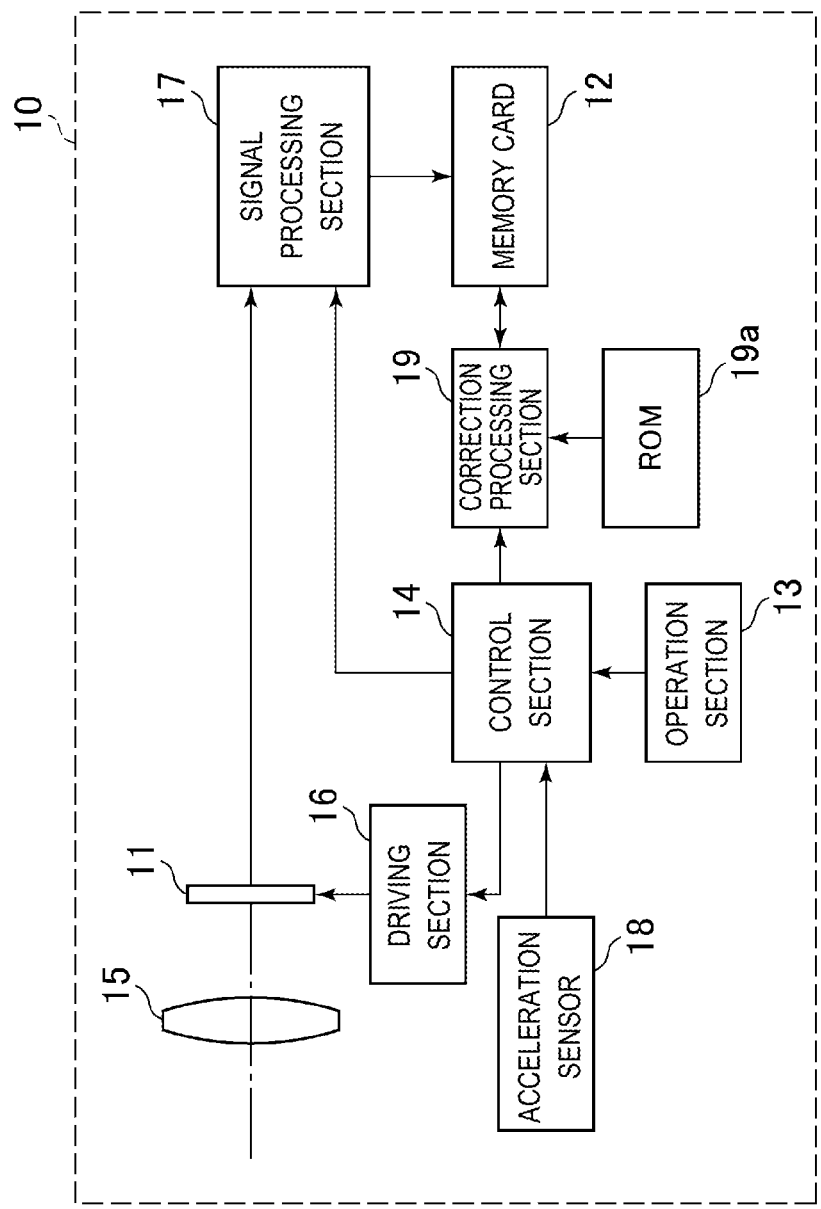
FIG. 1 is a block diagram illustrating a configuration of a camera system implementing the present invention.

In FIG. 1, a camera system 10 is installed onboard an automobile and used as a drive recorder, and is provided with an image sensor 11 as a solid-state imaging device. The camera system 10 has a normal mode, a save mode, and a readout mode. The normal mode is an operating mode in which a moving image is captured using the image sensor 11 and the moving image is recorded in a memory card 12 acting as a recording medium, similarly to a device such as a drive recorder of the related art. The camera system 10 automatically goes into the normal mode when powered on, for example.

The save mode is an operating mode which is switched to from the normal mode in response to a trigger signal issued during the normal mode. In the save mode, a still image for 1 frame (subject image) taken immediately after switching the operating mode is saved in the image sensor 11 in a non-volatile manner. The readout mode is an operating mode for reading out, from the image sensor 11 to outside, the still image held inside the image sensor 11 in the save mode. For example, the operating mode is switched to the readout mode according to an operation on an operation section 13, and the still image held in the image sensor 11 is read out and programmed to the memory card 12.

A control section 14 controls each section of the camera system 10 on the basis of operation signals from the operation section 13, which includes various operating buttons and the like. The image sensor 11 is disposed behind a photographic lens 15, and subject light transmitted through the photographic lens 15 is incident on a light-receiving face of the image sensor 11. A CMOS sensor is used as the image sensor 11. Although omitted from illustration, the photographic lens 15 is provided with components such as a focus mechanism for adjusting the focus and a diaphragm mechanism for adjusting the amount of incident light on the image sensor 11.

A plurality of pixels P (see FIG. 2) are provided on the light-receiving face of the image sensor 11. The image sensor 11 is driven by various driving signals from a driving section 16 that operates under control by the control section 14, and photoelectrically converts subject light in each pixel P to output an electrical image signal. Through the driving section 16, the control section 14 issues various signals to each pixel P, including a program voltage and a readout voltage described later. In the normal mode, the image sensor 11 is driven continuously to capture a moving image. The image signal from the image sensor 11 is sent to a signal processing section 17. The image sensor 11 also has a function of holding a still image of the subject in a non-volatile manner.

The signal processing section 17 processes the image signal from the image sensor 11 by performing processes such as gamma correction and white balance correction, a process of generating moving image data from sequentially input image signals, and the like. The moving image data generated by the signal processing section 17 is programmed in the memory card 12. In the normal mode, recording to the memory card 12 is continued until an acceleration equal to or greater than a predetermined threshold value is detected as described later. With this arrangement, a moving image is recorded to the memory card 12 until an event such as a collision occurs. Additionally, in the readout mode, the signal processing section 17 programs the still image read out from the image sensor 11 in the memory card 12.

The memory card 12 is removable, and can be removed from the camera system 10 and loaded into a device such as a PC to display moving images and still images recorded on the memory card 12 on a display such as an LCD monitor. Note that moving images and still images may also be recorded to different memory cards 12. Moving images and still images may also be output to a recording medium other than a memory card or to a device.

The camera system 10 is provided with an acceleration sensor 18 that acts as an event detector. The acceleration sensor 18 detects acceleration imparted to the camera system 10, and outputs a detection signal corresponding to the acceleration. The detection signal is sent from the acceleration sensor 18 to the control section 14. The control section 14 switches the operating mode to the save mode when an acceleration of a magnitude equal to or greater than a predetermined threshold value is detected on the basis of the detection signal in the normal mode. The threshold value is set with reference to the acceleration that occurs when the automobile collides with a wall or another automobile at a certain speed or higher, or when another automobile collides into the automobile, for example. With this arrangement, the control section 14 detects, as an event, that the automobile equipped with the camera system 10 collides with a wall or another automobile at a certain speed or higher, or the automobile is collided with another automobile, and in response to the detection of the event, the control section 14 holds a still image when the event occurred in the image sensor 11.

In this example, the detection signal indicating an acceleration of a magnitude equal to or greater than the threshold value is a trigger signal for detecting a predetermined event. Note that the event to be detected is not limited to the above-described, and it is sufficient to use a sensor corresponding to the event to be detected as the event detector.

A correction processing section 19 corrects the still image read out from the image sensor 11 in the readout mode. The correction reduces phenomena such as reset noise and noise caused by variations in the threshold voltage of an amplifying transistor 38 inside the pixels P (see FIG. 3) on the basis of correction data. For example, the correction data is created on the basis of the results of performing predetermined test image-taking a plurality of times on individual image sensors 11, and is programmed in ROM 19a. During correction, the correction processing section 19 reads out the correction data from the ROM 19a.

Figure 2:
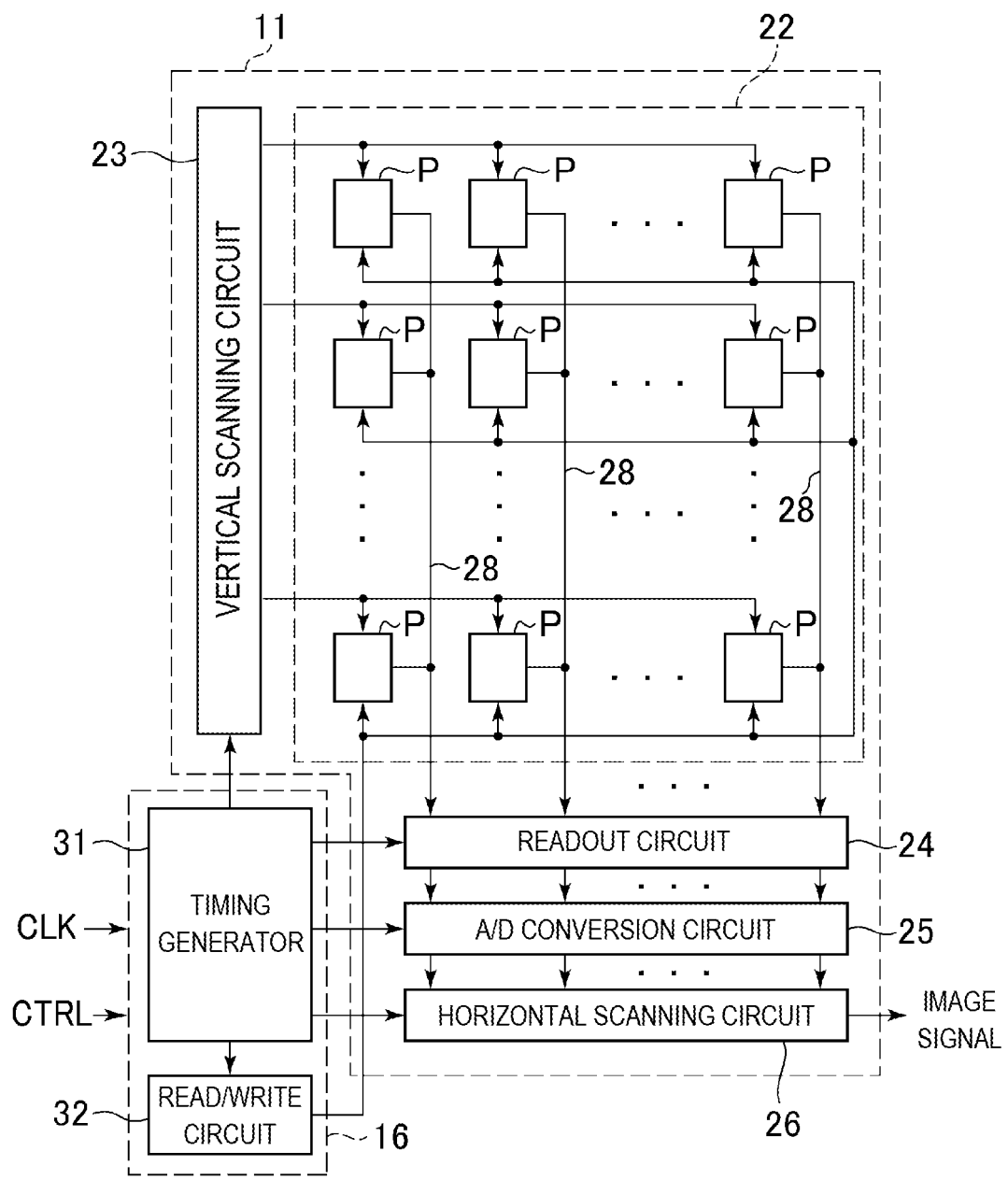
FIG. 2 is a block diagram illustrating a configuration of an image sensor and a driving section.

As illustrated in FIG. 2, the image sensor 11 includes a pixel array 22 in which the pixels P are arrayed in a matrix of rows and columns, a vertical scanning circuit 23, a readout circuit 24, an A/D conversion circuit 25, and a horizontal scanning circuit 26. The pixel array 22 is provided on the light-receiving surface of the image sensor 11. The pixels P are connected to the vertical scanning circuit 23 by row, and are also connected to vertical signal lines 28 acting as signal output lines by column. Each vertical signal line 28 is connected to the readout circuit 24 and outputs, to the readout circuit 24, a 1-pixel image signal from a pixel P selected by the vertical scanning circuit 23 from among the pixels P in the corresponding column.

The driving section 16 connected to the image sensor 11 includes a timing generator 31 and a read/write circuit 32, and operates on the basis of a clock (CLK) and an operation control signal (CTRL) from the control section 14. The timing generator 31 sends various timing signals to the vertical scanning circuit 23, the readout circuit 24, the A/D conversion circuit 25, and the horizontal scanning circuit 26. The read/write circuit 32 supplies a gate voltage MG and a source side select gate signal SG. The gate voltage MG and the source side select gate signal SG will be described later.

In the normal mode and the readout mode, the vertical scanning circuit 23 sequentially shifts the row to be selected in the vertical direction (the up-and-down direction in the diagram) on a predetermined cycle, and sends a timing signal corresponding to the operating mode to each pixel P in the selected row. In the save mode, the vertical scanning circuit 23 selects the pixels P in each row at the same time and causes each selected pixel P to operate at the same time.

In the readout circuit 24, components such as a load transistor 33 (see FIG. 3) that acts as a constant current source and a CDS circuit 34 (see FIG. 3) are provided for each column of the pixels P. The A/D conversion circuit 25 includes an A/D converter provided for each column of the pixels P, and digitally converts the image signal processed by the readout circuit 24. The horizontal scanning circuit 26 includes components such as a shift register for example, and latches each image signal from the A/D conversion circuit 25 per 1 row to output an image signal for 1 row. By outputting a number of image signals equal to the number of rows in the pixel array 22, a 1-frame image signal is output.

Figure 3:
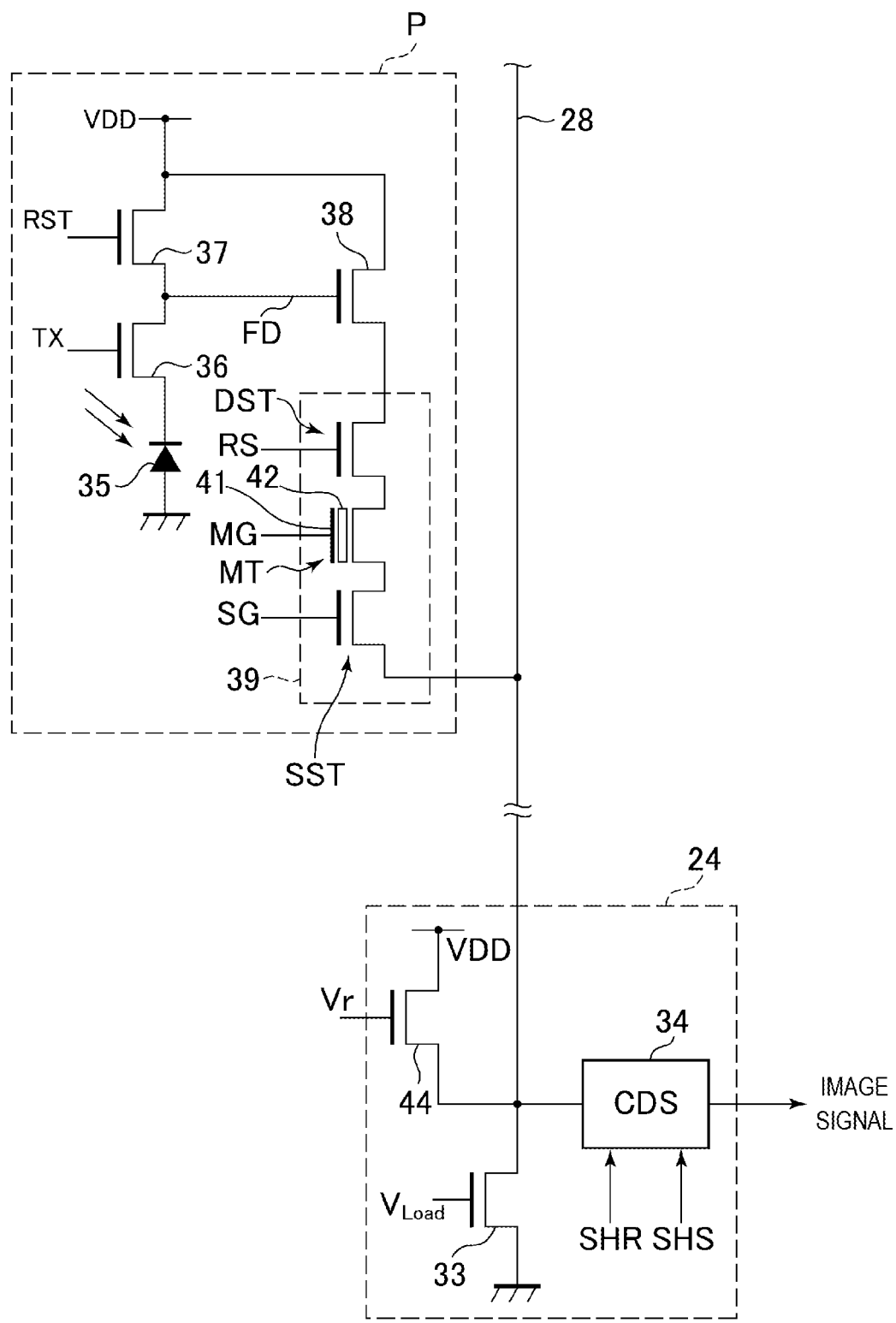
FIG. 3 is a circuit diagram illustrating a configuration of a pixel.

As illustrated in FIG. 3, each pixel P includes a photodiode 35 that photoelectrically converts incident light, a transfer transistor 36, a reset transistor 37, an amplifying transistor 38, a floating diffusion FD, and a memory element 39 that acts as a non-volatile memory section. The configuration of the pixels P is the same as the circuit configuration referred to as the four-transistor (4T) cell, except that the memory element 39 is used instead of the select transistor of the related art.

Light that has passed through the photographic lens 15 is incident on the photodiode 35. During an exposure period, the photodiode 35 generates and stores charge of an amount corresponding to the amount of incident light. The source of the transfer transistor 36 is connected to the photodiode 35, while the drain is connected to the floating diffusion FD. In a readout period that follows the exposure period, the transfer transistor 36 connected between the photodiode 35 and the floating diffusion FD controls the transfer of charge stored in the photodiode 35 to the floating diffusion FD. A transfer signal TX from the vertical scanning circuit 23 is input into the gate of the transfer transistor 36, and the transfer transistor 36 is switched on and off by the transfer signal TX. When the transfer transistor 36 is switched on, the charge in the photodiode 35 is transferred to the floating diffusion FD. The floating diffusion FD converts the charge into a potential corresponding to the amount of the charge, as is commonly known.

The reset transistor 37 resets the potential of the floating diffusion FD. The drain of the reset transistor 37 is connected to a power supply line VDL (see FIG. 6) and is thereby given a power supply voltage VDD (for example, 1.2 V), while the source is connected to the floating diffusion FD. A reset signal RST from the vertical scanning circuit 23 is input into the gate of the reset transistor 37, and the reset transistor 37 is switched on and off by the reset signal RST. When the reset transistor 37 is switched on, the charge in the floating diffusion FD is swept out to the power supply line VDL, thereby making the potential of the floating diffusion FD equal to the potential of the power supply line VDL (that is, equal to VDD) and resetting the potential of the floating diffusion FD. By switching on the reset transistor 37 while the transfer transistor 36 is also switched on, the exposure time (charge storage time) in the pixels P can be adjusted. Also, in the readout mode, the reset transistor 37 is switched on so as to keep the gate potential of the amplifying transistor 38 at a fixed potential.

The floating diffusion FD is connected to the gate of the amplifying transistor 38. The floating diffusion FD causes the amount of charge in the photodiode 35 to be converted into a potential that is applied to the gate of the amplifying transistor 38. The drain of the amplifying transistor 38 is connected to the power supply line VDL and is thereby given the power supply voltage VDD, while the source is connected to one terminal of the memory element 39. The amplifying transistor 38 is connected to the load transistor 33 described earlier via the memory element 39 and one of the vertical signal lines 28. The amplifying transistor 38 constitutes a source follower together with the load transistor 33, and acts as the input transistor of the source follower. The amplifying transistor 38 cooperates with the load transistor 33 to convert the potential of the floating diffusion FD into the signal voltage of an image signal corresponding to the potential, and output the signal voltage to the vertical signal line 28.

Although the detailed structure will be described later, the memory element 39 is structured such that a drain side select transistor DST, a memory transistor MT, and a source side select transistor SST are connected in series. One terminal of the memory element 39 is connected to the source of the amplifying transistor 38, while the other terminal is connected to the vertical signal line 28. It should be noted that the memory element 39 is not limited to a structure in which the memory transistor MT and the select transistors DST and SST are provided in an integrated manner like in this example. As described later, the memory element 39 may also be configured such that a non-volatile memory transistor and each of the select transistors are provided separately, and the select transistors are connected to the drain and source, respectively, of the non-volatile memory transistor.

The drain side select transistor DST is switched on and off by a row select signal RS from the vertical scanning circuit 23, while the source side select transistor SST is switched on and off by the source side select gate signal SG from the read/write circuit 32. The memory transistor MT includes a memory gate electrode 41 and a charge storage layer 42, and the operation of the memory transistor MT is controlled by the gate voltage MG applied to the memory gate electrode 41 from the read/write circuit 32.

In the normal mode, the amplifying transistor 38 and the vertical signal line 28 are connected by putting the memory element 39 into a conducting state. With this arrangement, the memory element 39 outputs an image signal corresponding to the potential of the floating diffusion FD to the CDS 34. In the save mode, the memory element 39 stores charge corresponding to the potential of the floating diffusion FD according to the amount of light received by the photodiode 35 in the charge storage layer 42. In this way, by holding the amount of light received by the photodiode 35, which is an analog amount, as an amount of charge in the charge storage layer 42 of the memory transistor MT, a still image is stored in the image sensor 11. Therefore, compared to a configuration that stores the amount of received light as digitally converted multi-bit digital data, the circuit configuration is reduced significantly in size and complexity, and is also effective in saving space. Furthermore, in the readout mode, the memory element 39 outputs an image signal of a level corresponding to the amount of charge stored in the charge storage layer 42 to the vertical signal line 28. The image signal output to the vertical signal line 28 is converted into multi-bit digital data by the A/D conversion circuit 25.

Since the memory element 39 is provided on the interconnect that connects the amplifying transistor 38 and the vertical signal line 28 as above, it is not necessary to provide an additional signal line for supplying the signal of the still image to be stored in the memory element 39.

In the readout circuit 24, the load transistor 33 and the CDS circuit 34 described earlier as well as a transistor 44 are provided for each column. The CDS circuit 34 is connected to the vertical signal line 28. Sampling signals SHR and SHS from the timing generator 31 are sequentially input into the CDS circuit 34. With this arrangement, the CDS circuit 34 samples the signal voltage of the image signal after the reset of the floating diffusion FD and the signal voltage after the transfer of charge from the photodiode 35, and outputs the difference between the two as an image signal from which noise has been removed. The image signal from the CDS circuit 34 is sent to the A/D conversion circuit 25.

The transistor 44 produces a pseudo-signal voltage in the readout mode. The drain of the transistor 44 is connected to the power supply line VDL, while the source is connected to the vertical signal line 28. In the readout mode, a predetermined gate voltage Vr is applied at timings synchronized with the sampling signal SHR, thereby causing the transistor 44 to cooperate with the load transistor 33 and output the pseudo-signal voltage to the vertical signal line 28. With this arrangement, a signal voltage not influenced by the charge stored in the charge storage layer 42 is obtained at timings synchronized with the sampling signal SHR. During other periods, the transistor 44 is switched off.

Figure 4:
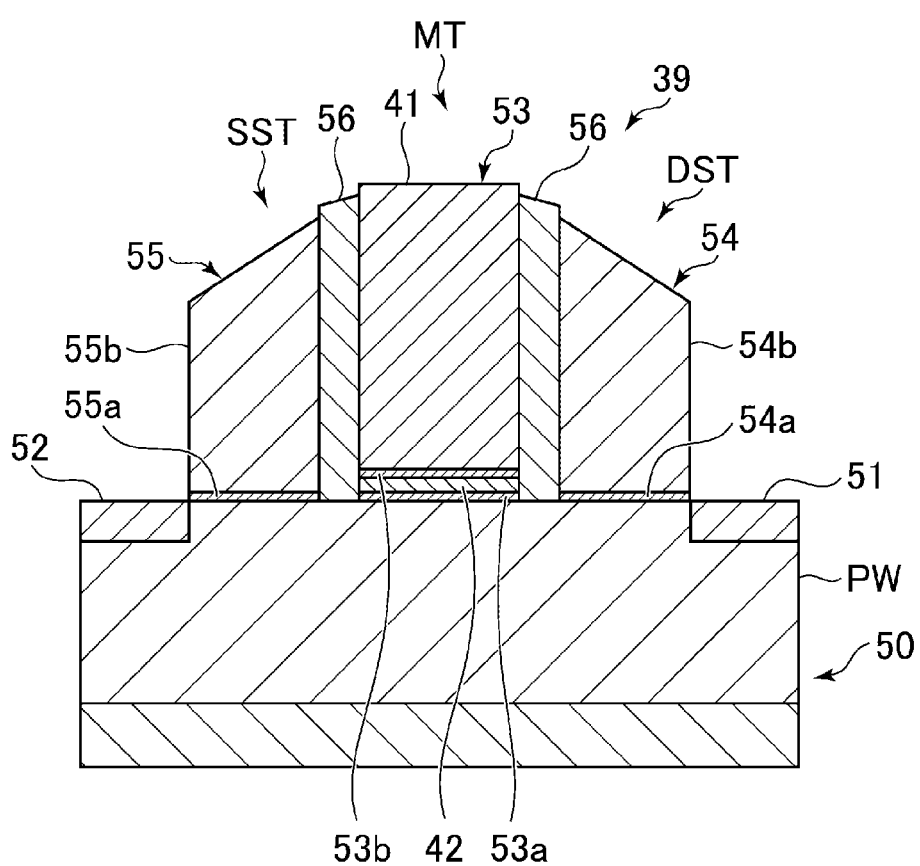
FIG. 4 is a cross-section illustrating a configuration of a memory element.

Next, the cross section of the memory element 39 will be described. As illustrated in FIG. 4, the memory element 39 is disposed on a p-well region PW provided on a semiconductor substrate 50. The memory transistor MT, the drain side select transistor DST, and source side select transistor SST, each being an n-type MOSFET, are provided on the p-well region PW.

A drain 51 and a source 52 of the memory element 39 are both provided as n-type semiconductor regions separated by a predetermined spacing in a surface of the p-well region PW. On the p-well region PW, a memory gate structure 53 is disposed between the drain 51 and the source 52, with a drain side select gate structure 54 disposed between the memory gate structure 53 and the drain 51, and a source side select gate structure 55 disposed between the memory gate structure 53 and the source 52. A sidewall spacer 56 made of an insulating material is respectively disposed between the memory gate structure 53 and the drain side select gate structure 54, and also between the memory gate structure 53 and the source side select gate structure 55.

In this example, the source side select transistor SST is the first select transistor while the drain side select transistor DST is the second select transistor. Also, the source side select gate structure 55 is a first gate structure while the drain side select gate structure 54 is a second gate structure.

The memory gate structure 53 includes a lower memory gate insulating film 53a, a charge storage layer 42, an upper memory gate insulating film 53b, and the memory gate electrode 41, which are layered in this order from the p-well region PW side. The gate voltage MG is applied to the memory gate electrode 41. The charge storage layer 42 contains a material such as silicon nitride ($Si_3N_4$), silicon oxynitride (SiON), or alumina ($Al_2O_3$), for example.

The drain side select gate structure 54 includes a drain side select gate insulating film 54a and a drain side select gate electrode 54b, which are layered in this order from the p-well region PW side. The row select signal RS is input into the drain side select gate electrode 54b. The source side select gate structure 55 includes a source side select gate insulating film 55a and a source side select gate electrode 55b, which are layered in this order from the p-well region PW side. The source side select gate signal SG is input into the source side select gate electrode 55b. The p-well region PW is grounded and has a potential of 0 V.

The source of the amplifying transistor 38 is connected to the drain 51, while the vertical signal line 28 is connected to the source 52. Note that the drain 51 is the drain of the memory element 39 while also simultaneously being the drain of the drain side select transistor DST, and the source 52 is the source of the memory element 39 while also simultaneously being the source of the source side select transistor SST. Also, in the respective portions of the p-well region PW between the drain side select transistor DST and the memory transistor MT and also between the source side select transistor SST and the memory transistor MT, a region that would act as a source or drain for any of the transistors DST, MT, and SST is not provided.

Figure 5:
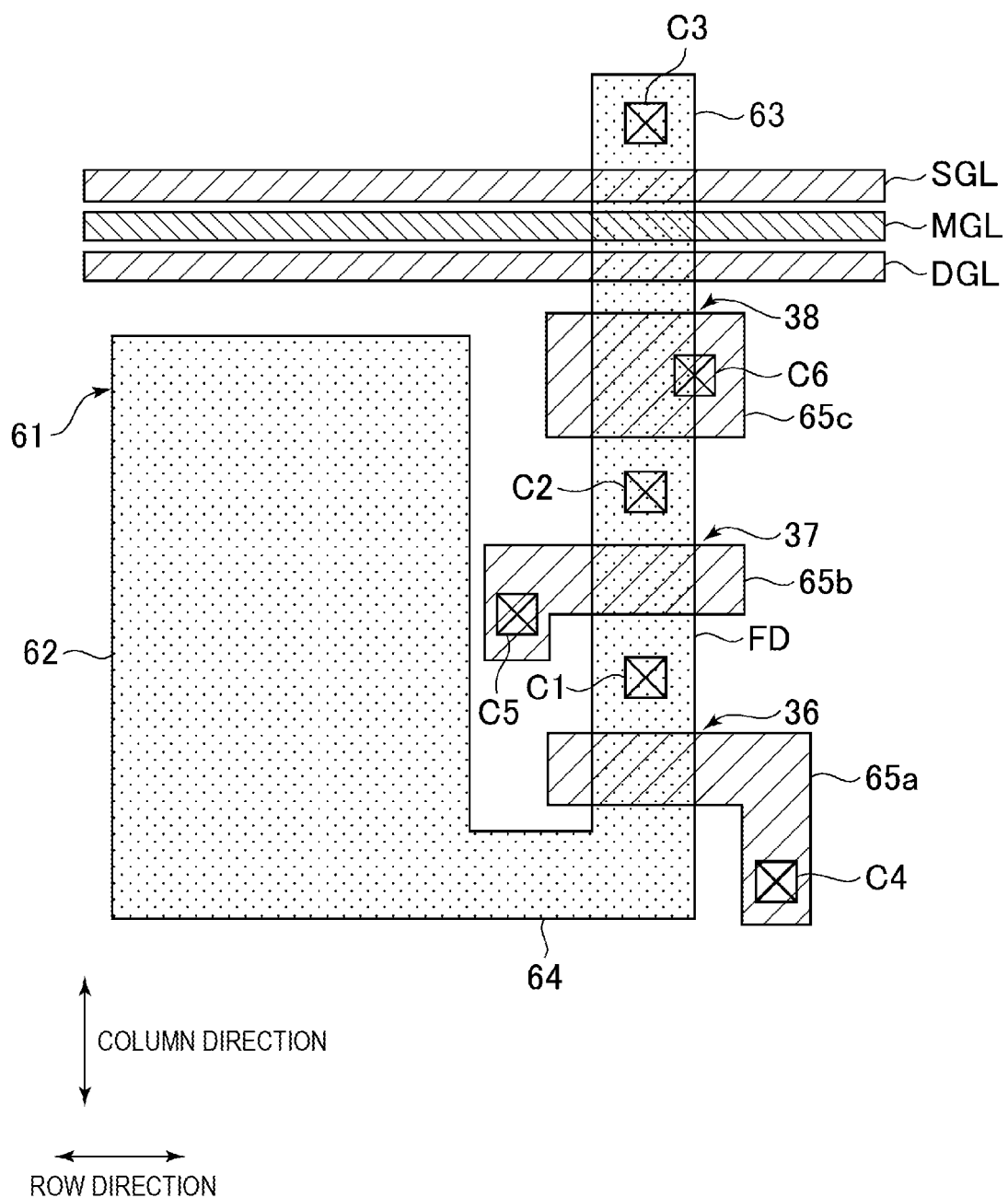
FIG. 5 is a schematic diagram illustrating an arrangement of an active region, gate interconnects, and contacts.
Figure 6:
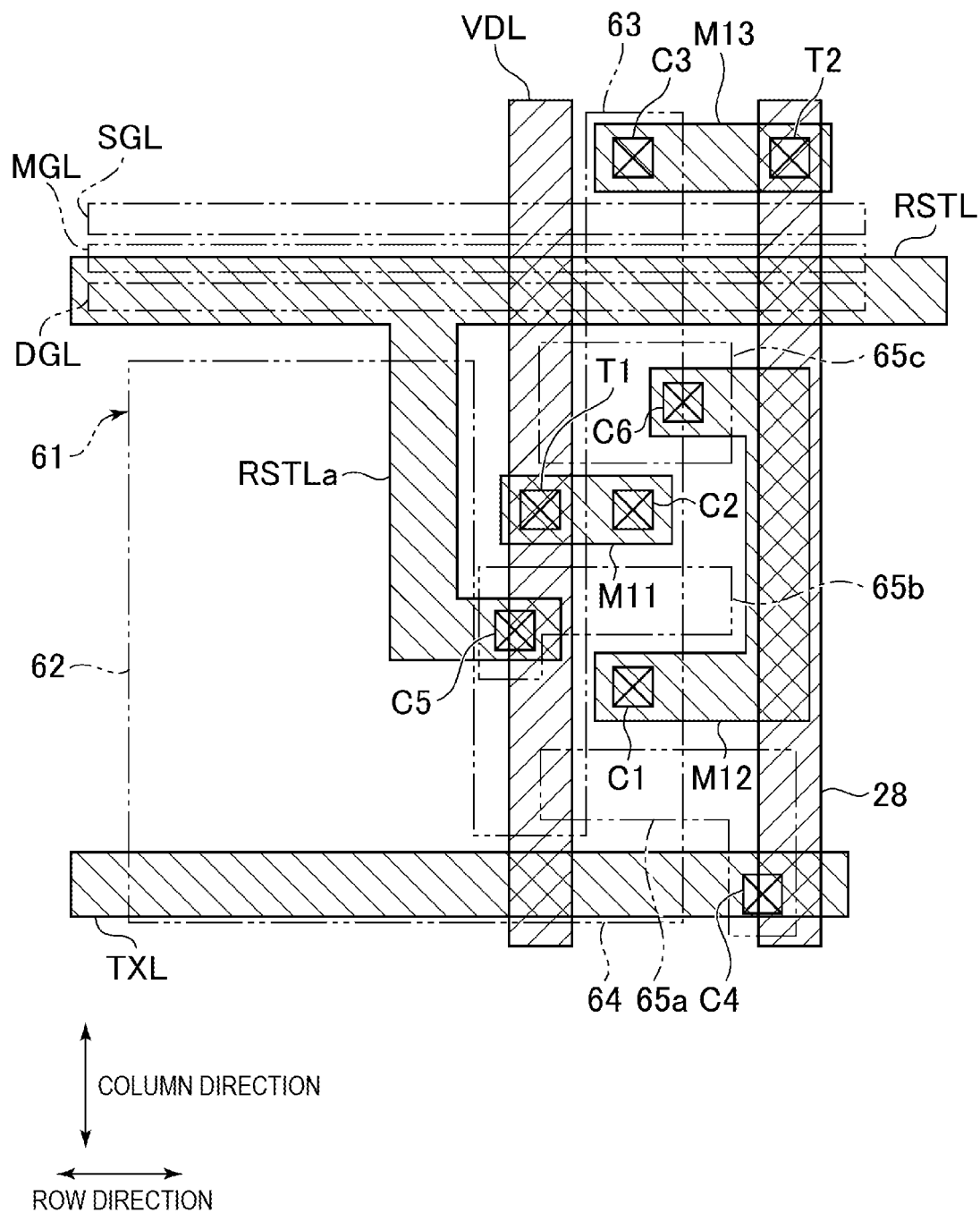
FIG. 6 is a schematic diagram illustrating an arrangement of metal interconnects and through-holes in a first metal layer and a second metal layer.

Next, a plan layout of one of the pixels P will be described with reference to FIGS. 5 and 6. However, the plan layout is not limited to the plan layout according to the embodiment described hereinafter. FIG. 5 illustrates an arrangement of an active region where the drain, source, and channel regions of each transistor are provided, gate interconnects, and contacts provided on the active region or on the gate interconnects. FIG. 6 illustrates an arrangement of the contacts together with respective metal interconnects in a first metal layer above the contacts and a second metal layer above the first metal layer, and through-holes that connect the first and second metal layers.

As illustrated in FIG. 5, an active region 61 is demarcated by an isolation film on the surface of the semiconductor substrate 50. The active region 61 includes a broad part 62 that is broadly rectangular, a narrow part 63 of narrower width than the broad part 62 and extending alongside 1 edge of the broad part 62 with a predetermined gap therebetween, and a joining part 64 that connects the broad part 62 and the narrow part 63 at their ends. The narrow part 63 is longer than the broad part 62 in the column direction. The broad part 62 is an n-type region, and constitutes the photodiode 35. Note that the direction in which the broad part 62 and the narrow part 63 are arranged is the row direction, while the direction in which the narrow part 63 extends (the direction orthogonal to the row direction) is the column direction.

Gate interconnects 65a to 65c that act as the gate electrodes of the transfer transistor 36, the reset transistor 37, and the amplifying transistor 38, respectively, are provided across the narrow part 63 in the row direction and in the above order starting from the joining part 64. The portion of the narrow part 63 between the gate interconnect 65a and the gate interconnect 65b is the floating diffusion FD.

A memory gate line MGL, a drain side select gate line DGL, and a source side select gate line SGL all extend in the row direction, and are disposed across one end of the narrow part 63 in the row direction. These lines are disposed as follows in order of closeness to the joining part 64: drain side select gate line DGL, memory gate line MGL, source side select gate line SGL. The gate voltage MG is supplied to the memory gate line MGL, the row select signal RS is supplied to the drain side select gate line DGL, and the source side select gate signal SG is supplied to the source side select gate line SGL. The portions of the memory gate line MGL, the drain side select gate line DGL, and the source side select gate line SGL lying on the narrow part 63 become the memory gate electrode 41 of the memory transistor MT, the drain side select gate electrode 54b of the drain side select transistor DST, and the source side select gate electrode 55b of the source side select transistor SST in the memory element 39, respectively. The memory gate line MGL is shared in common with the pixels P on the same row, but the respective memory gate lines MGL of each of the rows may also be electrically connected. In other words, the respective memory gate electrodes 41 of each of the pixels P of the pixel array 22 may be electrically connected.

In this example, the memory gate line MGL is made of a first layer polysilicon layer, while the drain side select gate line DGL, the source side select gate line SGL, and the gate interconnects 65a to 65c are made of a second layer polysilicon layer. The memory gate line MGL, the drain side select gate line DGL, the source side select gate line SGL, and the gate interconnects 65a to 65c may also be made of a polysilicon layer or a metal layer of the same layer.

The position where the memory element 39 is provided, or in other words the position where the source side select gate line SGL, the memory gate line MGL, and the drain side select gate line DGL are provided on the narrow part 63 as described above, is the position where the select transistor is disposed according to the 4T pixel layout of the related art. Consequently, it is possible to embed the image sensor 11 into the memory element 39 and hold a still image by making few changes to the layout. The memory element 39 also saves space because of the integration of the drain side select transistor DST that functions as the select transistor of the related art and the memory transistor MT that stores an amount of charge corresponding to the amount of light received by the photodiode 35, that is, a pixel of the still image.

Contacts C1 to C6 are respectively provided in the portion of the narrow part 63 that is the floating diffusion FD, in the portion of the narrow part 63 between the gate interconnects 65b and 65c, at one end of the narrow part 63 on the opposite side from the joining part 64, and in an end portion of each of the gate interconnects 65a to 65c.

In FIG. 6, a reset signal line RSTL and a transfer signal line TXL, both of which are metal interconnects, and metal interconnects M11 to M13 are provided in the first metal layer. The power supply line VDL and the vertical signal line 28, both of which are metal interconnects, are provided in the second metal layer. The reset signal line RSTL and the transfer signal line TXL extend in the row direction, while the power supply line VDL and the vertical signal line 28 extend in the column direction. The transfer signal line TXL is disposed on the edge portion of the active region 61 that connects to the joining part 64, while the reset signal line RSTL is disposed outside the broad part 62 in proximity to the edge of the broad part 62 on the opposite side away from the joining part 64. The power supply line VDL is disposed above the area between the broad part 62 and the narrow part 63, while the vertical signal line 28 is disposed at a position such that the narrow part 63 is interposed between the power supply line VDL and the vertical signal line 28 in the row direction.

The transfer signal line TXL is connected to the gate interconnect 65a through the contact C4, and the transfer signal TX is supplied to the transfer transistor 36 through the transfer signal line TXL. The reset signal line RSTL is provided with a contiguous branching part RSTLa. The branching part RSTLa extends toward the broad part 62 with one end bent in the row direction to have an L-shape. The bent end of the L-shape is connected to the contact C5. With this arrangement, the gate interconnect 65b is connected to the reset signal line RSTL, and the reset signal RST is supplied to the reset transistor 37.

The metal interconnect M11 is a rectangle elongated in the row direction, with one end connected through the contact C2 to the portion of the narrow part 63 that becomes the drain of the amplifying transistor 38, and the other end connected to the power supply line VDL via a through-hole T1. The metal interconnect M12 is shaped like a rectangle running alongside the narrow part 63, but with both ends of the rectangle bent in the row direction. One of these ends is connected through the contact C1 to the floating diffusion FD, while the other end is connected through the contact C6 to the gate interconnect 65c that acts as the gate of the amplifying transistor 38. The metal interconnect M13 is a rectangle elongated in the row direction, with one end connected through the contact C3 to the portion of the narrow part 63 that becomes the source 52 of the memory element 39, and the other end connected to the vertical signal line 28 via a through-hole T2.

Next, the action of the above configuration will be described. For example, the charge storage layer 42 of each memory transistor MT is initialized by an erase operation performed when the camera system 10 is manufactured. In the erase operation, the source side select gate signal SG and the row select signal RS for each pixel P are both set to an L level (0 V), and in a state where the source side select transistor SST and the drain side select transistor DST are both switched off, an erase voltage (for example, −12 V) is applied to the memory gate electrode 41 as the gate voltage MG. With this arrangement, the potential difference between the memory gate electrode 41 and the p-well region PW at 0 V causes a quantum tunneling effect in which charge is drawn out from the charge storage layer 42 toward the p-well region PW, and the charge storage layer 42 is initialized.

When powered on, the camera system 10 works in the normal mode to start imaging. In the normal mode, a normal voltage (for example, the power supply voltage VDD) is applied by the read/write circuit 32 as the gate voltage MG to the memory transistor MT of each pixel P, while in addition, the source side select gate signal SG supplied to the source side select transistor SST of each pixel P is set to an H level (for example, the power supply voltage VDD). In a manner similar to camera systems of the related art, the exposure period and the readout period are shifted row by row to convert and store light incident on the photodiode 35 in the pixels P as charge during the exposure period, and to convert and output the stored charge as an image signal during the readout period.

For 1 pixel P on any row, by having the vertical scanning circuit 23 set each of the transfer signal TX and the reset signal RST to the L level before that row is selected, or in other words during the exposure period of the row containing the target pixel P, the transfer transistor 36 and the reset transistor 37 are switched off, and the photodiode 35 converts and stores incident light as charge. At this time, the duration of the conversion and storage of incident light as charge is adjusted according to the timings when the transfer transistor 36 and the reset transistor 37 flip from on to off during the exposure period.

Figure 7:
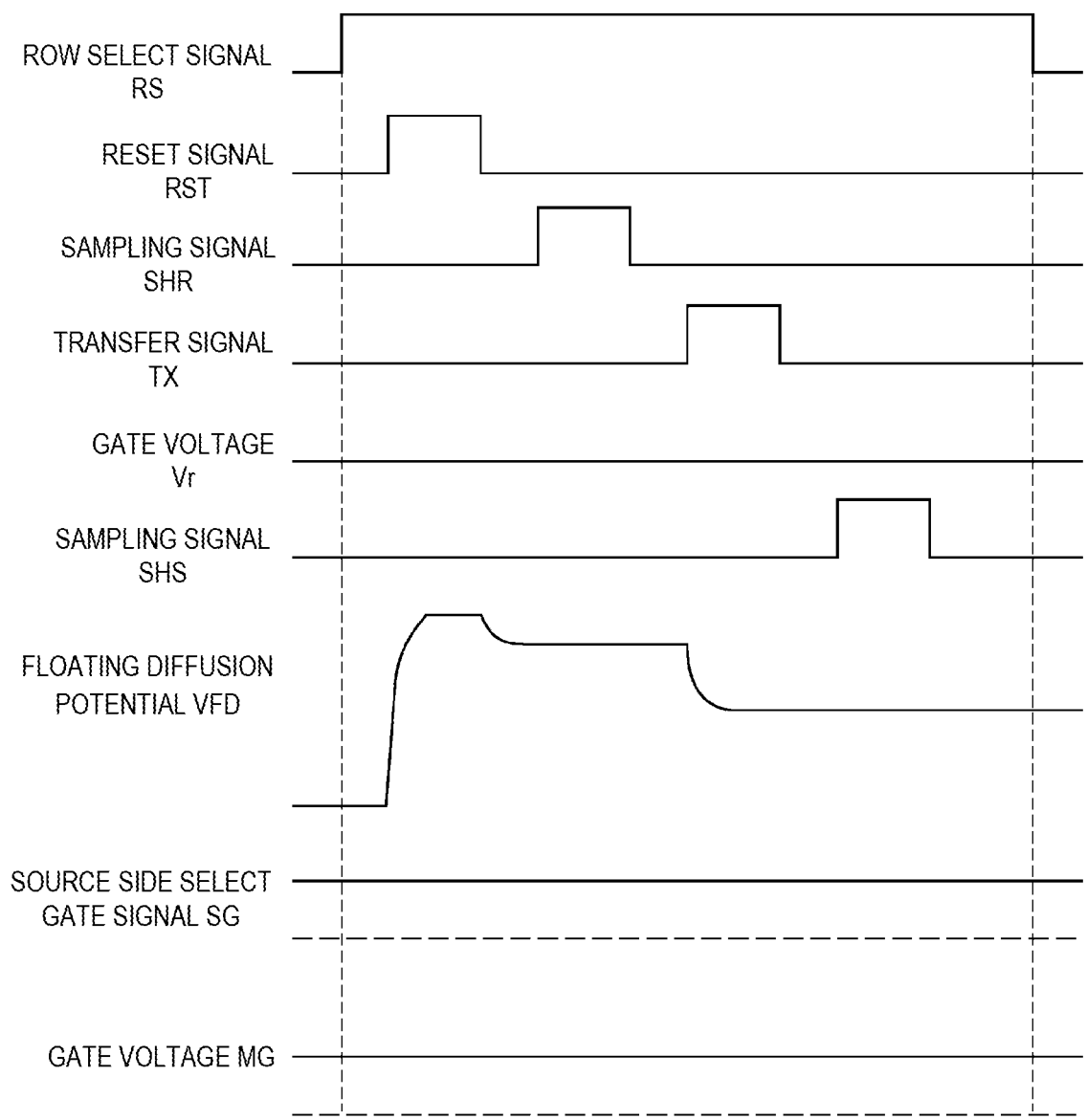
FIG. 7 is a timing chart illustrating changes in each signal during a readout period in a normal mode.

When the readout period following the exposure period begins, the vertical scanning circuit 23 sets the row select signal RS for the row containing the above-described pixel P to the H level, as illustrated in FIG. 7. Since the gate voltage MG is the normal voltage, and the source side select gate signal SG and the row select signal RS are both at the H level, the drain side select transistor DST, the memory transistor MT, and the source side select transistor SST of the memory element 39 are respectively switched on, and the source of the amplifying transistor 38 becomes connected to the vertical signal line 28.

After that, the reset signal RST is set to the H level by the vertical scanning circuit 23. With this arrangement, the reset transistor 37 is switched on and the floating diffusion FD is reset. After the reset signal RST flips to the L level and the reset transistor 37 is switched off, the sampling signal SHR from the timing generator 31 is input into the CDS circuit 34. Since a signal voltage corresponding to the potential of the floating diffusion FD is being output to the vertical signal line 28, a signal voltage corresponding to the potential of the reset floating diffusion FD is sampled by the CDS circuit 34 as a first sampling voltage.

After sampling the first sampling voltage, the vertical scanning circuit 23 sets the transfer signal TX to the H level. The H level switches on the transfer transistor 36, causing the charge stored in the photodiode 35 to be transferred to the floating diffusion FD. After the transfer signal TX flips to the L level and the transfer transistor 36 is switched off, the sampling signal SHS from the timing generator 31 is input into the CDS circuit 34. At this time, since the floating diffusion FD reaches a potential that corresponds to the amount of charge stored in the photodiode 35, a signal voltage corresponding to the amount of charge stored in the photodiode 35, or in other words the amount of incident light, is sampled by the CDS circuit 34 as a second sampling voltage.

The CDS circuit 34 outputs the difference between the first sampling voltage and the second sampling voltage as a 1-pixel image signal with noise removed. By performing a similar operation on the pixels P in each column, the image signals for 1 row are output simultaneously from the readout circuit 24 to the A/D conversion circuit 25. Each image signal is digitized by the A/D conversion circuit 25 and sent to the horizontal scanning circuit 26, and the horizontal scanning circuit 26 outputs a 1-row image signal containing a time series of each of the 1-pixel image signals. Rows are sequentially selected by the row select signal RS, and 1-row image signals for each of the selected rows are sequentially output.

The image signals output from the image sensor 11 are processed by the signal processing section 17 into the image data of a moving image, which is sequentially recorded to the memory card 12. In this way, the moving image stored in the memory card 12 is played back by loading the memory card 12 into a device such as a PC.

Figure 8:
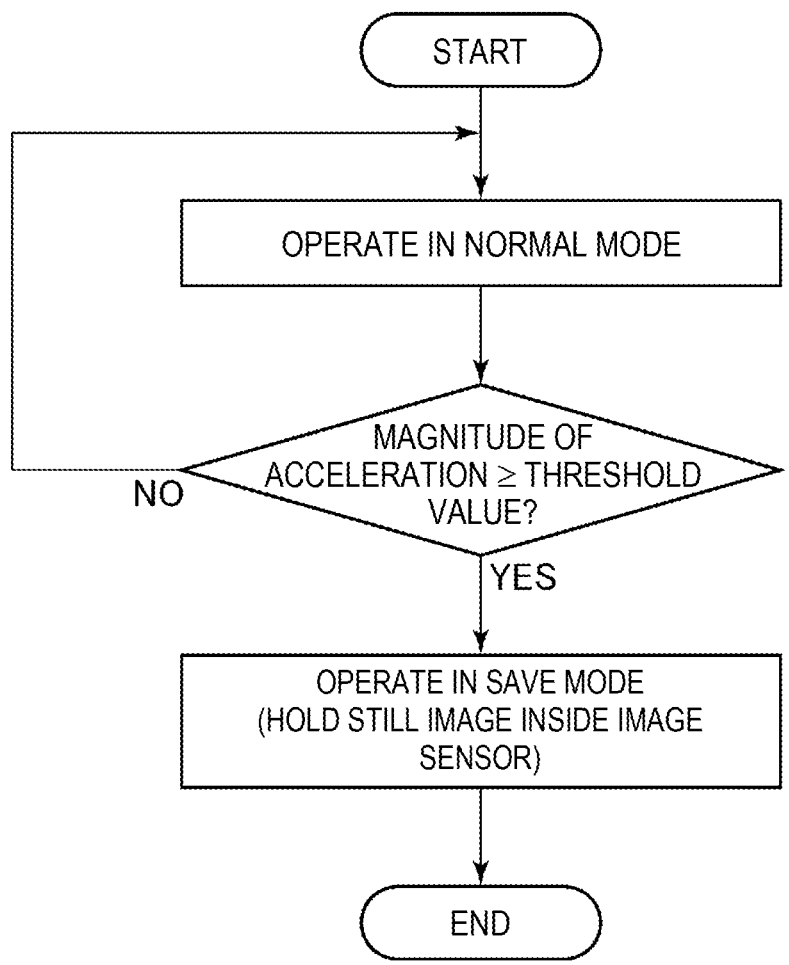
FIG. 8 is a flowchart illustrating a process of determining to switch from the normal mode to a save mode.

As illustrated in FIG. 8, during the operations in the normal mode above, the control section 14 monitors acceleration imparted the camera system 10 by referencing the detection signal from the acceleration sensor 18. The operations in the normal mode are continued in the case where the acceleration does not exceed a threshold value.

On the other hand, in the case where the acceleration exceeds the threshold value, the control section 14 sends the operation control signal CTRL for operating in the save mode to the driving section 16. Through the input of the operation control signal CTRL, the imaging and the recording of a moving image performed in the normal mode until then are stopped, and the operating mode switches to the save mode.

Upon switching to the save mode, the vertical scanning circuit 23 causes the pixels P to operate simultaneously in the exposure period and the readout period. The operations of the pixels P in the exposure period are similar to the case of the normal mode, and charge corresponding to the amount of incident light is stored by the photodiode 35 of each pixel P. The read/write circuit 32 applies the normal voltage as the gate voltage MG to the memory transistor MT of each pixel P, and the source side select gate signal SG supplied to the source side select transistor SST of each pixel P is also set to the H level.

Figure 9:
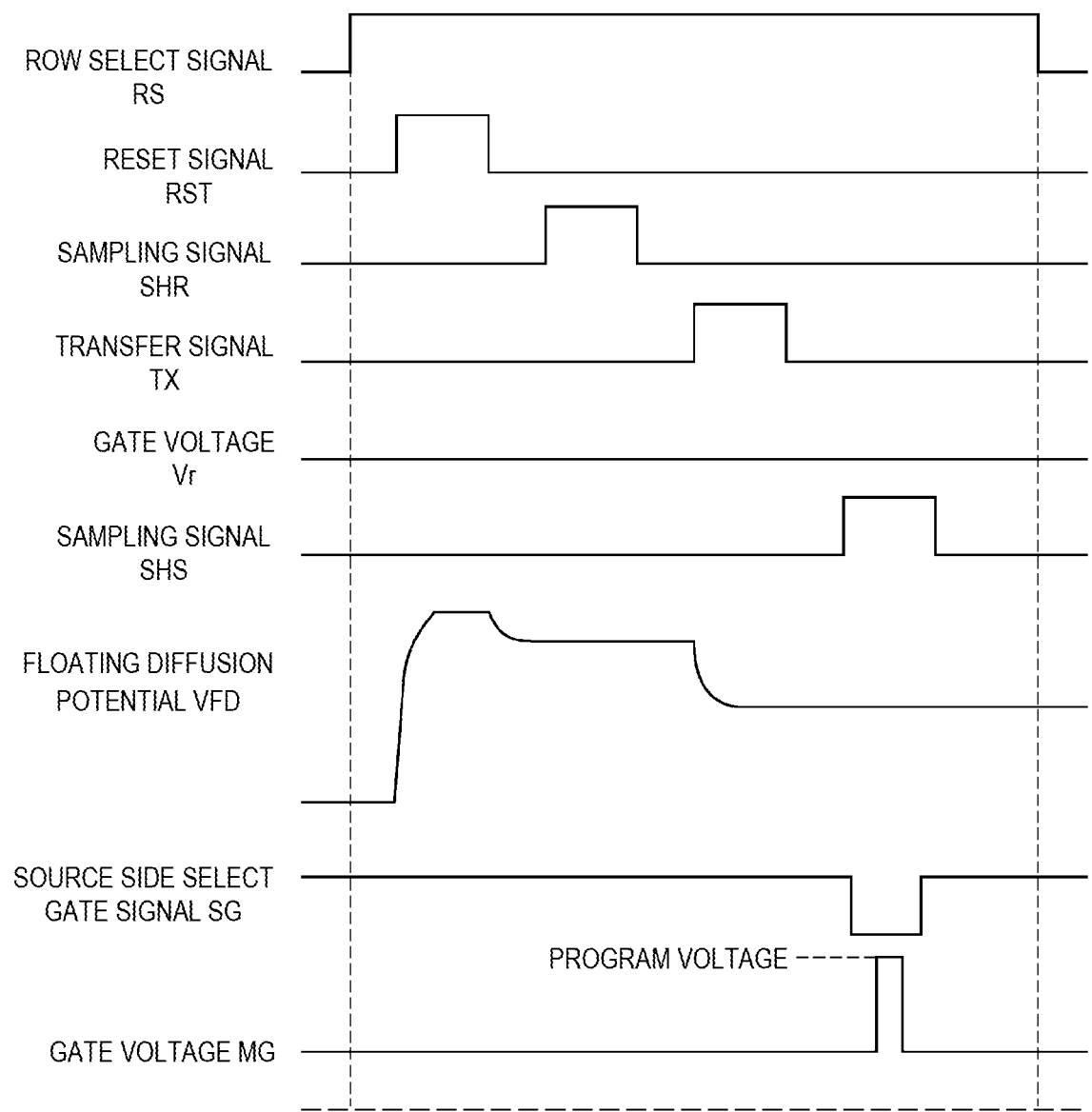
FIG. 9 is a timing chart illustrating changes in each signal during a readout period in the save mode.

As illustrated in FIG. 9, when the readout period begins, the vertical scanning circuit 23 sets the row select signal RS for each row to the H level. With this arrangement, the drain side select transistor DST of each pixel P in each row is switched on, and the amplifying transistor 38 becomes connected to the memory transistor MT. Likewise, for the readout period, the reset transistor 37 and the transfer transistor 36 of each pixel P are switched on and off in order. With this arrangement, after the floating diffusion FD is reset, the charge stored by the photodiode 35 during the exposure period is transferred to the floating diffusion FD. Note that since the sampling voltages by the CDS circuit 34 are not used in the save mode, the sampling signals SHR and SHS do not have to be produced.

After the charge in the photodiode 35 is transferred to the floating diffusion FD, the read/write circuit 32 sets the source side select gate signal SG to the L level at the same timing as the sampling signal SHS. With this arrangement, the source side select transistor SST is switched off, and the memory transistor MT is disconnected from the vertical signal line 28. Additionally, while the source side select transistor SST is switched off, the read/write circuit 32 sets the gate voltage MG to a program voltage. The program voltage is a higher voltage than the normal voltage, such as 9 V for example.

The program voltage is applied to the memory gate electrode 41, and charge is stored in the charge storage layer 42 by the quantum tunneling effect. Since the source side select transistor SST is off and the drain side select transistor DST is on at this point, by applying the program voltage to the memory gate electrode 41, the potential of the p-well region PW directly underneath the memory gate structure 53 becomes equal to the potential of the drain 51. The potential of the drain 51 is the same as the potential of the source of the amplifying transistor 38 (output potential), and the potential of the source of the amplifying transistor 38 is determined by the potential of the floating diffusion FD. Furthermore, the potential of the floating diffusion FD is determined by the amount of charge forwarded from the photodiode 35, or in other words, the amount of light received by the photodiode 35. Consequently, the potential of the drain 51 corresponds to the amount of light received by the photodiode 35. Since the program voltage is constant, the potential difference between the memory gate electrode 41 and the p-well region PW directly underneath the memory gate structure 53 (hereinafter referred to as the "PROGRAM voltage") has a magnitude that corresponds to the amount of light received by the photodiode 35. Since the amount of charge stored in the charge storage layer 42 due to the quantum tunneling effect varies depending on the PROGRAM voltage, charge of an amount corresponding to the amount of light received by the photodiode 35 is stored in the charge storage layer 42. The storage of charge in the charge storage layer 42 causes the threshold voltage (gate threshold voltage) of the memory transistor MT to change, and the change amount of the threshold voltage corresponds to the amount of stored charge.

As above, by applying the program voltage to the memory gate electrode 41 after transferring the charge in the photodiode 35 to the floating diffusion FD in each pixel P, the amount of light received by the photodiode 35 becomes stored in the charge storage layer 42 as an amount of charge. The charge stored in the charge storage layer 42 is held without being erased, even if the camera system 10 is powered off. Consequently, a still image is stored in the image sensor 11 in a non-volatile manner as an image of the instant when the automobile equipped with the camera system 10 collides with a wall or another automobile at a certain speed or higher, for example. In the save mode, the still image is recorded by causing the pixels P to operate simultaneously, and therefore there is no time lag between the pixels of the still image stored in the image sensor 11.

For example, in a case in which the program voltage is set to 9 V, the gate voltage of the drain side select transistor DST (the H level of the row select signal RS) is set to 1.2 V, and the potential of the drain 51 is set to 0 V, when the application time for applying the program voltage is taken to be 100 µs, the memory transistor MT is capable of securing a change amount in the threshold voltage (Vth window) greater than 1.2 V with respect to the state in which the charge storage layer 42 is initialized. Also, if the application time is taken to be 1 ms, a change amount in the threshold voltage greater than 1.7 V is obtained. In this way, a large change amount in the threshold voltage is obtained even with a short application time of the program voltage, and the resolving power of pixel gradations in the still image is increased. Also, since the programming utilizes the quantum tunneling effect, the current that flows due to applying the program voltage to the memory transistor MT is less than 1 pA per 1 pixel for example, and even if the image sensor 11 has a pixel count of 5 million pixels, the program current that flows during programming is 5 µA or less. Consequently, there is no particular problem even if the program voltage is applied to each of the pixels P simultaneously.

As above, since the amount of charge stored in the charge storage layer 42 cannot be changed by an external operation, it is difficult to rewrite or erase the still image stored in the image sensor 11 with an external operation. The operating mode may also be configured such that, after having switched to the save mode once, switching back to the save mode again is prohibited or switching back to the save mode is denied until a predetermined unlock operation is performed. With such a configuration, it is possible to prevent overwriting and erasure of the still image stored in the image sensor 11.

The reason why the source side select transistor SST is switched off when storing charge in the charge storage layer 42 is for disconnecting the memory transistor MT from the vertical signal line 28 and storing charge in the charge storage layer 42 without being influenced by the potentials of other circuits connected to the vertical signal line 28. The charge storage layer 42 of each memory element 39 may also be initialized by performing an erase operation before storing charge in the charge storage layer 42 by applying the program voltage.

In the case of retrieving the still image stored in the image sensor 11, the operation section 13 is operated to issue a readout instruction. In response to the readout instruction, the control section 14 causes each section of the camera system 10 to operate in the readout mode.

Figure 10:
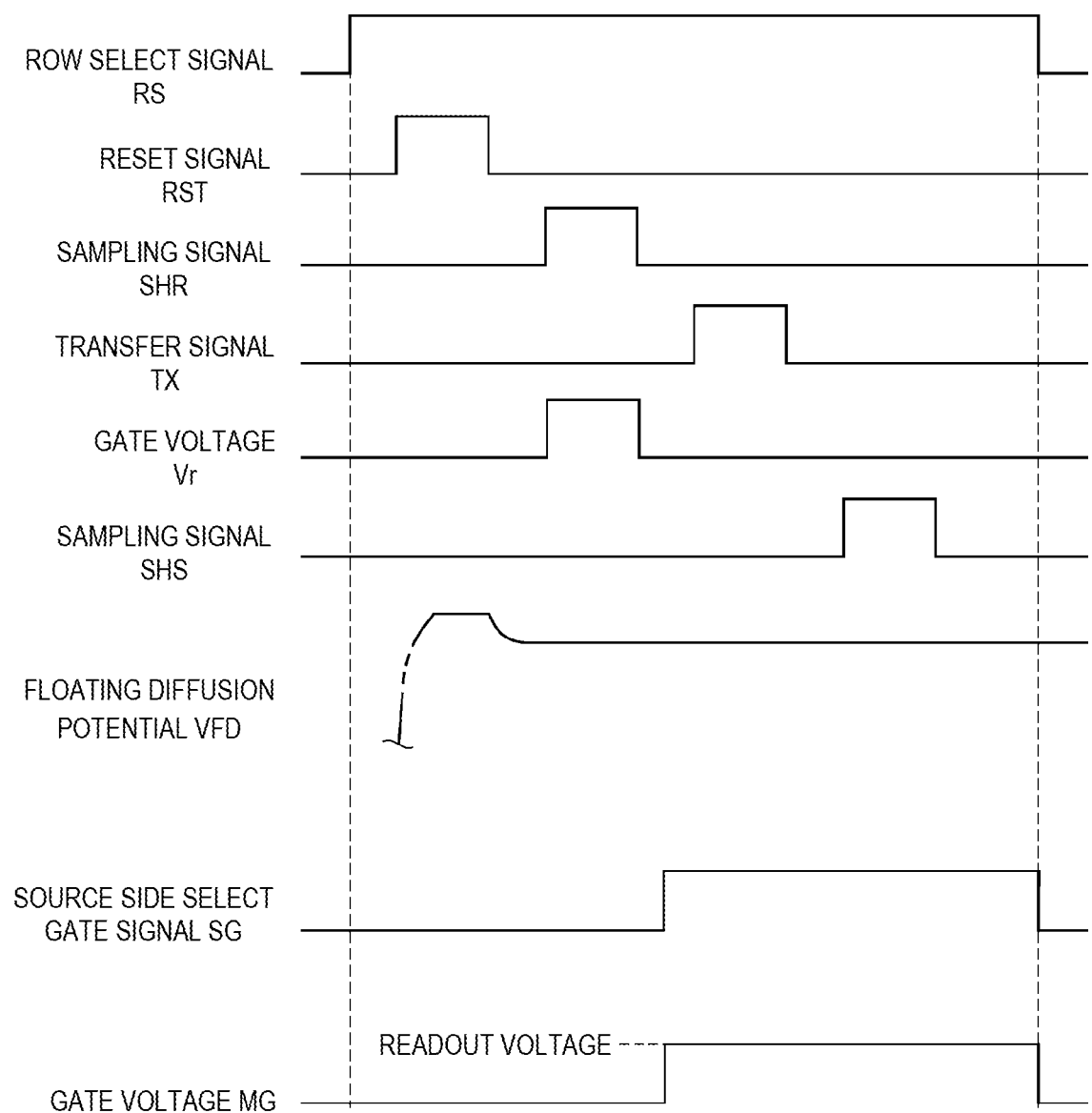
FIG. 10 is a timing chart illustrating changes in each signal in a readout mode.

When the readout mode begins, each row is selected at staggered timings by having the vertical scanning circuit 23 sequentially set the row select signal RS for each row to the H level. As illustrated in FIG. 10, when the vertical scanning circuit 23 sets the row select signal RS to the H level, the drain side select transistor DST of the memory element 39 switches on in each pixel P of the corresponding row. The drain side select transistor DST is switched on, but since the gate voltage MG is at 0 V and the source side gate signal is at the L level at the beginning of the readout mode, the source of the amplifying transistor 38 and the vertical signal line 28 are in a disconnected state.

After that, the reset signal RST is switched to the H level and the reset transistor 37 is switched on, which resets the floating diffusion FD. At the timing when the sampling signal SHR is input into the CDS circuit 34, the predetermined gate voltage Vr is supplied to the gate of the transistor 44. With this arrangement, a pseudo-signal voltage corresponding to the gate voltage Vr is output to the vertical signal line 28, and the pseudo-signal voltage is sampled by the CDS circuit 34 as the first sampling voltage. In this way, a fixed pseudo-signal voltage is used as the first sampling voltage, regardless of the amount of charge stored in the charge storage layer 42.

After the first sampling voltage is sampled, the source side select gate signal SG is set to the H level by the read/write circuit 32. With this arrangement, the source side select transistor SST is switched to the on state together with the drain side select transistor DST that was switched on earlier. Also, the gate voltage MG is set to the readout voltage. Herein, the readout voltage is taken to be a voltage higher than the maximum value of a threshold voltage anticipated in the state in which charge is stored in the charge storage layer 42. In this example, the readout voltage is taken to be the power supply voltage VDD. The threshold voltage of the memory transistor MT also changes depending on the amount of charge stored in the charge storage layer 42. Furthermore, since charge has been stored in the charge storage layer 42 in the save mode, and the amount of the charge corresponds to the amount of light received by the photodiode 35, the threshold voltage at this point corresponds to the amount of light received by the photodiode 35 during the save mode. Meanwhile, the constant potential of the reset floating diffusion FD is being applied to the gate of the amplifying transistor 38. As a result, a signal voltage corresponding to the amount of charge stored in the charge storage layer 42 is output to the vertical signal line 28. More specifically, the signal voltage becomes lower as the amount of charge stored in the charge storage layer 42 becomes greater.

Note that since the transfer signal TX is not set to the H level in the readout mode, the floating diffusion FD is kept at the potential reset by the switching on and off of the reset transistor 37.

After the source side select gate signal SG is set to the H level and the gate voltage MG is set to the readout voltage as above, the sampling signal SHS is input into the CDS circuit 34. With this arrangement, a signal voltage determined by the amount of charge stored in the charge storage layer 42 is sampled by the CDS circuit 34 as the second sampling voltage. The CDS circuit 34 outputs the difference between the first sampling voltage and the second sampling voltage as a 1-pixel image signal. In this way, a 1-pixel image signal corresponding to the amount of light received by the photodiode 35 in the save mode is output.

By performing a similar operation on the pixels P in each column, the image signals for 1 row are output simultaneously from the readout circuit 24 to the A/D conversion circuit 25, and each image signal is digitized by the A/D conversion circuit 25. Subsequently, the horizontal scanning circuit 26 outputs a 1-row image signal containing a time series of each of the 1-pixel image signals. Rows are sequentially selected by the row select signal RS, and 1-row image signals for each of the selected rows are sequentially output. In this way, the respective image signals of the rows are output, processed by the signal processing section 17, and recorded in the memory card 12 as a 1-frame still image.

After the still image is recorded in the memory card 12, the correction processing section 19 corrects each pixel of the still image recorded in the memory card 12 on the basis of corresponding correction data read out from the ROM 19a, thereby reducing noise in the still image.

The still image recorded in the memory card 12 can be viewed by loading the memory card 12 into a device such as a PC and displaying the still image on a monitor. The still image taken when an acceleration equal to or greater than a threshold value was detected is displayed on the monitor.

In the above example, the power supply voltage VDD (>0 V) is applied as the gate voltage when the source side select transistor SST is switched on, but the source side select transistor SST may also be configured to have a threshold voltage less than 0 V and switch on when the gate voltage is 0 V. The same is true of the memory transistor MT, which may be configured to have a threshold voltage less than 0 V in the state in which the charge storage layer 42 is initialized, and 0 V may be applied as the normal voltage. Also, in the case of reading out the still image recorded in the image sensor 11, the signal voltage itself when the readout voltage is applied to the memory transistor MT may be used as the image signal of each pixel P. In this case, the transistor 44 is omitted, and the CDS circuit 34 outputs the signal voltage to the A/D conversion circuit 25 while the readout voltage is being applied to the memory transistor MT.

Figure 11:
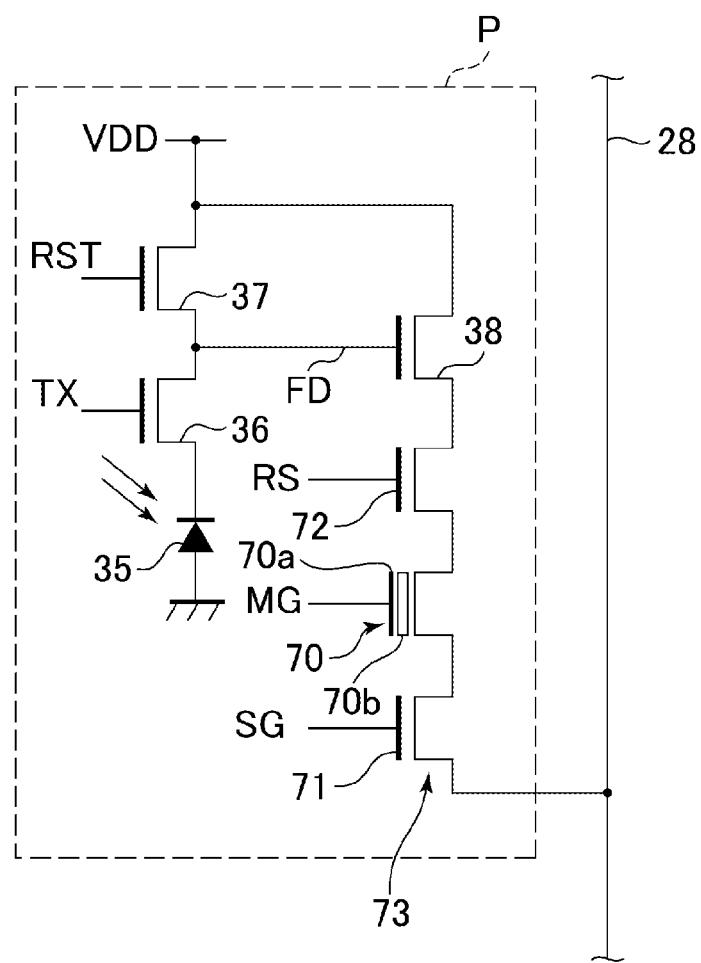
FIG. 11 is a circuit diagram illustrating an example of configuring the non-volatile memory section with 3 discrete transistors.

In the foregoing embodiment, a memory element integrating the memory transistor, the first select transistor, and the second select transistor is used, but these transistors may also be configured as discrete elements. For example, in the example illustrated in FIG. 11, a non-volatile memory section 73 includes a memory transistor 70, a first select transistor 71, and a second select transistor 72 configured as discrete elements. The memory transistor 70 includes a memory gate electrode 70a and a charge storage layer 70b. In the save mode, applying the program voltage to the memory gate electrode 70a causes charge to be stored, with the amount of charge corresponding to the potential of the drain, or in other words, corresponding to the amount of light received by the photodiode 35. The operations of the memory transistor 70, the first select transistor 71, and the second select transistor 72 are substantially the same as the memory transistor MT, the source side select transistor SST, and the drain side select transistor DST described earlier.

From the perspective of outputting only the image signals from the selected row (pixels) to the vertical signal line 28, it is sufficient to provide either one of the first select transistor 71 and the second select transistor 72. Also, from the perspective of disconnecting the pixels from the vertical signal line 28 when the program voltage is applied, that is, when charge is stored in the charge storage layer 70b, it is sufficient to provide the first select transistor 71. Consequently, for a configuration in which a plurality of pixels P are connected to the vertical signal line 28, the second select transistor 72 may be omitted. In this case, it is sufficient to switch on the first select transistor 71 in the readout period of the normal mode as well as in the readout mode, and switch off the first select transistor 71 when the program voltage is applied in the save mode.

The memory transistor MT and the memory transistor 70 described above may also be metal-oxide-nitride-oxide-silicon (MONOS) transistors in which the gate structure includes a silicon oxide film (tunneling insulating film), a charge storage layer made of a silicon nitride film or the like, a block insulating film made of a silicon oxide film or the like, and a metal gate electrode, which are layered in this order from the silicon substrate side. MONOS transistors also include silicon-oxide-nitride-oxide-silicon (SONOS) transistors, in which the gate electrode is made of heavily doped polysilicon. In this way, it is desirable to use a nitride film (silicon nitride film) as the charge storage layer, since a nitride film is capable of storing charge discretely and in a spatially uniform way, even if there are local defects in the tunneling insulating film. Because of this property, differences in the threshold voltage between memory transistors made to store charge in the charge storage layer under the same conditions are small and the reproducibility of the threshold voltage is also consistent, thereby making it possible to store pixel information accurately. The memory transistor 70 and the memory transistor MT may also be floating-gate transistors, which use a floating gate made of a conductive film such as polycrystalline silicon as the charge storage layer. The above MONOS transistors are a preferable structure since the differences in the threshold voltage between memory transistors can be reduced easily and the reproducibility of the threshold voltage can be ensured easily.

As above, a still image is recorded by applying a program voltage as the gate voltage to the memory transistor MT or the memory transistor 70 of a memory element provided inside each pixel P in the image sensor 11 of the camera system 10, and since the pixels of the still image are respectively held inside the pixels P, the still image is recorded without using a recording medium such as a memory card or an optical disc. Since the still image is recorded in the image sensor 11 in this way, it is difficult to rewrite or erase the still image with an external operation. The still image is also recorded by causing the pixels P to operate simultaneously, and therefore there are no time lag between the pixels of the still image stored in the image sensor 11, and the still image is recorded in an extremely short amount of time. Furthermore, since the analog amount of light received by the photodiode 35 is recorded in the image sensor 11 as an analog amount of charge in the charge storage layer 42 or 70b for each pixel of the still image, the circuit configuration is reduced significantly in size and complexity, and is also effective in saving space.

In each of the above examples, an amount of charge corresponding to the amount of light received by the photodiode, namely an analog amount, is saved in the memory transistor provided inside each pixel, and the number of memory elements (memory transistors) is reduced compared to a configuration that stores the amount of charge as digital data. From such a standpoint, the memory transistor may be provided at any position between the photodiode and the A/D conversion circuit.

REFERENCE SIGNS LIST 10 camera system
11 image sensor
14 control section
28 vertical signal line
35 photodiode
36 transfer transistor
37 reset transistor
38 amplifying transistor
39 memory element
51 drain
52 source
53 memory gate structure
54 drain side select gate structure
55 source side select gate structure
MT memory transistor
DST drain side select transistor
SST source side select transistor
P pixel
PW p-well region
70 memory transistor
71 first select transistor
72 second select transistor
73 non-volatile memory section

What is claimed is:

1. A solid-state imaging device provided with a pixel array in which a plurality of pixels are arranged,
each pixel comprising:
a photodiode;
a floating diffusion;
a transfer transistor connected between the photodiode and the floating diffusion;
an amplifying transistor having a gate connected to the floating diffusion; and
a non-volatile memory section connected between a signal output line and the amplifying transistor, wherein
the non-volatile memory section includes
a memory transistor connected in series with the amplifying transistor between the amplifying transistor and the signal output line, the memory transistor including a memory gate electrode and a charge storage layer, and
a first select transistor connected in series with the memory transistor between the amplifying transistor and the signal output line.

2. The solid-state imaging device according to claim 1, wherein
the non-volatile memory section additionally includes a second select transistor connected in series with the memory transistor between the memory transistor and the amplifying transistor.

3. The solid-state imaging device according to claim 2, wherein
the non-volatile memory section has
a drain and a source provided on a surface of a p-well region,
a memory gate structure that constitutes the memory transistor, including the charge storage layer and the memory gate electrode, disposed on the surface of the p-well region between the drain and the source,
a first gate structure that constitutes the first select transistor disposed on the surface of the p-well region between the memory gate structure and the source, and
a second gate structure that constitutes the second select transistor disposed on the surface of the p-well region between the memory gate structure and the drain.

4. The solid-state imaging device according to claim 1, each pixel further comprising:
a reset transistor connected between a power supply line and the floating diffusion.

5. The solid-state imaging device according to claim 2, wherein
at least one of the first select transistor and the second select transistor is switched off in a case where an image signal is not output to the signal output line.

6. The solid-state imaging device according to claim 1, wherein
the charge storage layer stores charge of an amount corresponding to an output potential of the amplifying transistor by applying a program voltage to the memory gate electrode, and
the memory transistor is switched on by an application of a normal voltage to the memory gate electrode in a state of no charge storage in the charge storage layer, and a threshold voltage of the memory transistor changes according to the amount of charge stored in the charge storage layer.

7. The solid-state imaging device according to claim 1, wherein
the solid-state imaging device has a normal mode, a save mode, and a readout mode,
in the normal mode, an image signal corresponding to a potential of the floating diffusion corresponding to an amount of light received by the photodiode is output to the signal output line,
in the save mode, charge of an amount corresponding to the potential of the floating diffusion corresponding to the amount of light received by the photodiode is stored in the charge storage layer, and a still image is stored, and
in the readout mode, an image signal corresponding to the amount of charge stored in the charge storage layer is output to the signal output line.

8. The solid-state imaging device according to claim 1, wherein
the signal output line is connected to the respective pixels, and
the first select transistor is connected between the memory transistor and the signal output line, is switched on in a case of outputting an image signal to the signal output line, and is switched off in a case of applying a program voltage to the memory transistor.

9. A camera system comprising:
the solid-state imaging device according to claim 1; and
a control section that applies a program voltage to the memory gate electrode in response to a trigger signal during imaging by the solid-state imaging device.

10. The camera system according to claim 9, further comprising:
an acceleration sensor that outputs a detection signal corresponding to an acceleration, wherein
the control section uses the detection signal indicating an acceleration equal to or greater than a predetermined threshold value as the trigger signal.

11. A solid-state imaging device having:
a normal mode in which an image signal corresponding to an amount of light received by a photodiode of a pixel is output;
a save mode in which an analog amount corresponding to the amount of light received by the photodiode as stored information in a non-volatile memory section is stored in a non-volatile manner; and a readout mode in which the stored information stored in the non-volatile memory section in the save mode is converted into a multi-bit digital image signal, and the multi-bit digital image signal is output, wherein switching back to the save mode is prohibited, or alternatively, switching back to the save mode is allowed if an unlock operation is performed.

12. A camera system comprising:

a plurality of pixels, each pixel including a photodiode;

an A/D conversion circuit that receives an image signal from each pixel as input;

a memory transistor, connected between the photodiode and the A/D conversion circuit, that stores stored information corresponding to an amount of light received by the photodiode in response to a trigger signal; and an event detector that produces the trigger signal by detecting a predetermined event.

13. The camera system according to claim 12, wherein the event detector is an acceleration sensor.

* * * * *